US010720533B2

(12) United States Patent
Hsieh et al.

(10) Patent No.: US 10,720,533 B2
(45) Date of Patent: Jul. 21, 2020

(54) NON-VOLATILE MEMORY DEVICE AND METHOD FOR MANUFACTURING THE SAME

(71) Applicant: Winbond Electronics Corp., Taichung (TW)

(72) Inventors: Chu-Chun Hsieh, Taichung (TW); Tse-Mian Kuo, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 19 days.

(21) Appl. No.: 16/124,723

(22) Filed: Sep. 7, 2018

(65) Prior Publication Data

US 2019/0081177 A1   Mar. 14, 2019

(30) Foreign Application Priority Data

Sep. 8, 2017 (CN) .......................... 2017 1 0803384

(51) Int. Cl.
*H01L 29/788* (2006.01)
*H01L 29/49* (2006.01)
(Continued)

(52) U.S. Cl.
CPC ...... *H01L 29/7883* (2013.01); *H01L 21/0234* (2013.01); *H01L 21/0262* (2013.01);
(Continued)

(58) Field of Classification Search
CPC ........... H01L 29/7883; H01L 29/40114; H01L 29/42324; H01L 29/4916
See application file for complete search history.

(56) References Cited

U.S. PATENT DOCUMENTS 5,514,902 A * 5/1996 Kawasaki ......... H01L 21/26506
257/607
5,629,221 A * 5/1997 Chao ................. H01L 21/28176
438/591

(Continued)

FOREIGN PATENT DOCUMENTS

CN   102347229 A   2/2012
CN   102376770 B   7/2015
(Continued)

OTHER PUBLICATIONS

Machine translation, Taiwanese IP Office office action dated Mar. 7, 2019, Taiwan Pat. App. No. 106130789, translation date: Nov. 21, 2019, all pages. (Year: 2019).*

(Continued)

*Primary Examiner* — Victoria K. Hall
(74) *Attorney, Agent, or Firm* — Muncy, Geissler, Olds & Lowe, P.C.

(57) ABSTRACT

A non-volatile memory device and its manufacturing method are provided. The non-volatile memory device includes a tunneling oxide layer, a floating gate, a dielectric layer, and a control gate. The tunneling oxide layer is formed on a substrate. The floating gate is formed on the tunneling oxide layer, and includes a first polysilicon layer, a second polysilicon layer, and a nitrogen dopant. A grain of the first polysilicon layer has a first grain size, and a grain of the second polysilicon layer has a second grain size that is greater than the first grain size. The nitrogen dopant is formed in interstices between the grains of the first polysilicon layer. The dielectric layer includes a first nitride film, an oxide layer, a nitride layer, and an oxide layer conformally formed on the floating gate. The control gate is formed on the dielectric layer.

6 Claims, 10 Drawing Sheets

(51) Int. Cl.
  *H01L 29/51*    (2006.01)
  *H01L 29/423*   (2006.01)
  *H01L 29/66*    (2006.01)
  *H01L 21/02*    (2006.01)
  *H01L 21/3215*  (2006.01)
  *H01L 21/28*    (2006.01)
  *H01L 21/762*   (2006.01)
  *H01L 21/3213*  (2006.01)

(52) U.S. Cl.
  CPC .. *H01L 21/02532* (2013.01); *H01L 21/02595* (2013.01); *H01L 21/32155* (2013.01); *H01L 21/76224* (2013.01); *H01L 29/40114* (2019.08); *H01L 29/42324* (2013.01); *H01L 29/4916* (2013.01); *H01L 29/513* (2013.01); *H01L 29/518* (2013.01); *H01L 29/66825* (2013.01); *H01L 21/02164* (2013.01); *H01L 21/32137* (2013.01)

(56) References Cited

U.S. PATENT DOCUMENTS

| | | | | |
|---|---|---|---|---|
| 5,885,877 A * | 3/1999 | Gardner | ............ | H01L 21/28035 257/E21.197 |
| 6,127,227 A * | 10/2000 | Lin | ............ | H01L 21/28211 438/261 |
| 6,153,470 A * | 11/2000 | He | ............ | H01L 29/42324 438/257 |
| 6,380,055 B2 * | 4/2002 | Gardner | ............ | H01L 21/28035 257/E21.197 |
| 6,396,099 B2 * | 5/2002 | Joo | ............ | H01L 29/40114 257/315 |
| 6,440,829 B1 * | 8/2002 | Roy | ............ | H01L 21/28176 257/E21.194 |
| 6,455,372 B1 * | 9/2002 | Weimer | ............ | B82Y 10/00 438/257 |
| 6,537,869 B1 | 3/2003 | Furuhata | | |
| 6,869,848 B2 * | 3/2005 | Kwak | ............ | H01L 21/26513 438/289 |
| 7,723,233 B2 * | 5/2010 | Krull | ............ | H01L 21/2255 257/296 |
| 9,356,110 B2 * | 5/2016 | Inoue | ............ | H01L 29/4925 |
| 2003/0216031 A1 | 11/2003 | Komagata | | |
| 2004/0132261 A1 * | 7/2004 | Cho | ............ | H01L 21/28202 438/369 |
| 2007/0080393 A1 * | 4/2007 | Togo | ............ | H01L 21/2658 257/315 |
| 2010/0184283 A1 * | 7/2010 | Kim | ............ | H01L 21/28202 438/592 |
| 2012/0018888 A1 * | 1/2012 | Ko | ............ | H01L 29/40114 257/751 |
| 2012/0043600 A1 * | 2/2012 | Van der Vegt | ............ | H01L 29/40114 257/316 |
| 2014/0312406 A1 * | 10/2014 | Inoue | ............ | H01L 21/28035 257/316 |
| 2018/0096849 A1 * | 4/2018 | Burke | ............ | H01L 21/28114 |
| 2018/0366573 A1 * | 12/2018 | Chou | ............ | H01L 29/4933 |

FOREIGN PATENT DOCUMENTS

| KR | 20090122860 A | 12/2009 |
|---|---|---|
| TW | 201501209 A1 | 1/2015 |

OTHER PUBLICATIONS

Taiwanese IP Office office action dated Mar. 7, 2019, Taiwan Pat. App. No. 106130789, all pages. (Year: 2019).*

Machine translation, Lee, Korean Pat. Pub. No. KR 2009-0122860, translation date: Apr. 24, 2020, Espacenet, all pages. (Year: 2020).*

* cited by examiner

NON-VOLATILE MEMORY DEVICE AND METHOD FOR MANUFACTURING THE SAME

CROSS REFERENCE TO RELATED APPLICATIONS

This Application claims priority of China Patent Application No. 201710803384.4, filed on Sep. 8, 2017, the entirety of which is incorporated by reference herein.

BACKGROUND

Field of the Disclosure

The present disclosure relates to a memory device, and in particular it relates to a non-volatile memory device and a method for manufacturing the non-volatile memory device.

Description of the Related Art

Flash memory has gradually become the mainstream of non-volatile memory because of its lower cost. Existing flash memory includes a floating gate having a doped polysilicon layer. The grain size of the doped polysilicon layer is susceptible to subsequent high-temperature processes, thereby increased. However, when the size of the grain that is in contact with the tunneling oxide layer is larger, the dopant in the polysilicon layer becomes more likely to gather at the interface with the tunneling oxide layer. As a result, the conductivity in some regions may abnormally increase, and problems such as over programming and over erasing may occur.

So-called "over programming" means that electrons still move from the substrate through the tunneling oxide layer to the floating gate even if no voltage is applied. So-called "over erasing" means that electrons still move from the floating gate through the tunneling oxide layer to the substrate even if no voltage is applied. When some regions of the interface between the floating gate and the tunneling oxide layer have high conductivity, over programming and/or over erasing can easily occur in these regions. Both over programming and over erasing result in errors in the operation of the non-volatile memory device. In addition, if over programming and/or over erasing occur, the variation of the threshold voltage of the flash memory will become greater after a durability test. Therefore, good reliability and good durability cannot be obtained.

With the recent trend of miniaturization of electronic products, there is a demand for miniaturization of non-volatile memory devices. Moreover, the reliability and durability issues of existing non-volatile memory devices will become more severe in miniaturized designs. Therefore, there is still demand for non-volatile memory devices with high durability, high reliability, and high product yield.

BRIEF SUMMARY

The disclosure provides a non-volatile memory device. The non-volatile memory device includes a tunneling oxide layer on a substrate, and a floating gate on the tunneling oxide layer. The floating gate includes a first polysilicon layer, a second polysilicon layer, and a nitrogen dopant. The first polysilicon layer includes a plurality of first polysilicon grains having a first grain size. The second polysilicon layer includes a dopant and a plurality of second polysilicon grains having a second grain size. The second grain size is greater than the first grain size. The nitrogen dopant is formed in the first polysilicon layer and in interstices between the plurality of first polysilicon grains. The non-volatile memory device also includes a dielectric layer on the floating gate, and a control gate formed on the dielectric layer. The dielectric layer including a first nitride film conformally formed on and covering the floating gate, and a three-layer structure consisting of a first oxide layer, a nitride layer, and a second oxide layer structure sequentially and conformally formed on the first nitride film.

The disclosure also provides a method for manufacturing a non-volatile memory device. The method includes forming a tunneling oxide layer on a substrate, and forming a floating gate on the tunneling oxide layer. Forming the floating gate includes performing a first deposition process to form a first polysilicon layer on the tunneling oxide layer, performing an ion implantation process to implant an impurity comprising $N_2$ into a surface of the first polysilicon layer, and performing a second deposition process to form a second polysilicon layer on the first polysilicon layer. The first polysilicon layer is an undoped polysilicon layer, and the second polysilicon layer is a polysilicon layer doped with a dopant. The method also includes performing a heat treatment process to form a plurality of first polysilicon grains having a first grain size in the first polysilicon layer, and to form a plurality of second polysilicon grains having a second grain size in the second polysilicon layer. The second grain size is greater than the first grain size. The method also includes forming a dielectric layer formed on the floating gate, and forming a control gate on the dielectric layer.

DETAILED DESCRIPTION

Figure 1A:
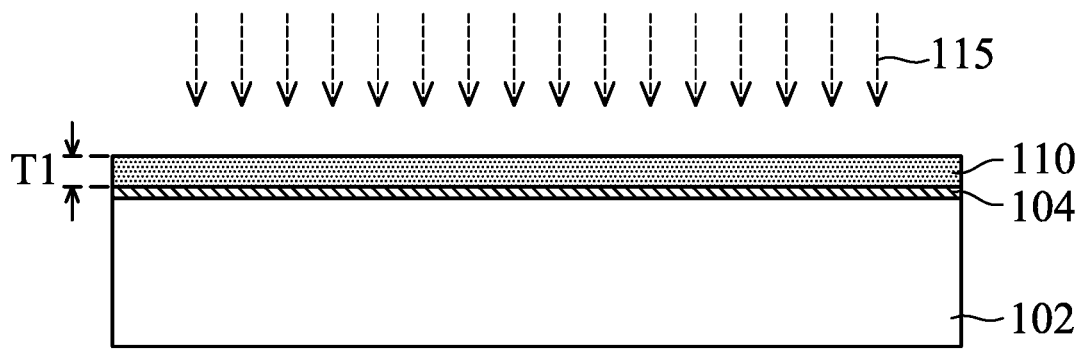
FIGS. 1A-1G show cross-sectional views of a non-volatile memory device in accordance with some embodiments.

The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

In the disclosure, the term "about" or "approximately" means in a range of 20% of a given value or range, preferably 10%, and more preferably 5%. In the disclosure, if there is no specific explanation, a given value or range means an approximate value which may imply the meaning of "about" or "approximately".

In the disclosure, the unit "%" of the indicated content is "atomic percentage (atom %)" or "ionic percentage (ion %)". For example, if the content of the X component is 10% and the content of the Y component is 90% in a material or structure, it means that there are 10× atoms (or ions) and 90 Y atoms (or ions) per 100 atoms (or ions) in the material or structure.

In some embodiments of the disclosure, a non-volatile memory device and a method for manufacturing the non-volatile memory device are provided. FIGS. 1A-1G show cross-sectional views of a non-volatile memory device 100 in accordance with some embodiments.

Referring to FIG. 1A, a tunneling oxide layer 104 is formed on a substrate 102. In some embodiments, the tunneling oxide layer 104 may be formed by thermal oxidation, but the invention is not limited to this. The substrate 102 may include an array region and a peripheral circuit region (not shown) adjacent to the array region. For the purpose of simplicity, FIGS. 1A-1G show merely cross-sectional views of the array region. The substrate 102 may be a semiconductor substrate. In some embodiments, the material of the substrate 102 may include silicon, gallium arsenide, gallium nitride, silicon germanium, silicon-on-insulator (SOI), other applicable materials, or a combination thereof. In some embodiments, other structures may be formed in the substrate 102, for example, an N-type well, a P-type well, a P/N junction, or an isolation structure.

In some embodiments, after the tunneling oxide layer 104 is formed, in order to form a thin nitride layer on the surface of the tunneling oxide layer 104, an optional nitrogen gas plasma treatment may be performed. The nitrogen gas plasma is electrically neutral as a whole, and it includes various species of nitrogen, for example, cation ($N^+$, $N_2^+$), anion ($N^-$, $N_2^-$), free radical ($N^*$, $N_2^*$), neutral nitrogen atom (N), and $N_2$ molecules. These species of nitrogen have applicable energy to generate a weak bonding force with the silicon atoms.

In some embodiments, after the tunneling oxide layer 104 is formed, an optional high-temperature annealing process in a nitrogen-containing gas environment may be performed. The nitrogen-containing gas may include nitrogen oxides, such as, nitrogen monoxide (NO), nitrogen dioxide ($NO_2$), dinitrogen oxide ($N_2O$), dinitrogen trioxide ($N_2O_3$), dinitrogen tetroxide ($N_2O_4$), or a combination thereof. The temperature of the annealing process may be 70-1200° C. In some embodiments, after the tunneling oxide layer 104 is formed, an optional nitrogen gas plasma treatment may be performed, and then, an optional high-temperature annealing process in the nitrogen-containing gas environment may be performed. The threshold voltage of the non-volatile memory device 100 may be improved by performing the nitrogen gas plasma treatment and/or the annealing process. The details will be discussed in the following paragraphs.

Then, a first deposition process is performed to form a first polysilicon layer 110 having a thickness T1 on the tunneling oxide layer 104. The first deposition process may include a chemical vapor deposition (CVD) process, an atomic layer deposition (ALD) process, other applicable deposition process, or a combination thereof. In some embodiments, the first polysilicon layer 110 may be formed by performing a low pressure chemical vapor deposition (LPCVD) in a furnace.

The first polysilicon layer 110 is an undoped polysilicon layer, and it is used to be a buffer layer or a barrier layer. The first polysilicon layer 110 may prevent the dopant (e.g., phosphorus or arsenic) in another polysilicon layer deposited subsequently from diffusing into the tunneling oxide layer 104 and affecting the electron tunneling effect. Therefore, the threshold voltage of the non-volatile memory device 100 may be improved. If the thickness of the first polysilicon layer 110 is too small, the threshold voltage cannot be significantly improved. On the other hand, since the undoped polysilicon layer has a higher electrical resistance value, if the thickness of the first polysilicon layer 110 is too large, the electrical resistance value of the non-volatile memory device 100 may be too high. Therefore, a higher operating voltage may be required. As a result, the energy consumption of the device may be increased and the durability of the device may be decreased. Accordingly, the thickness of the first polysilicon layer 110 may be controlled within an applicable range. In some embodiments, the thickness T1 of the first polysilicon layer 110 is 5-40 nm.

Figure 1B:
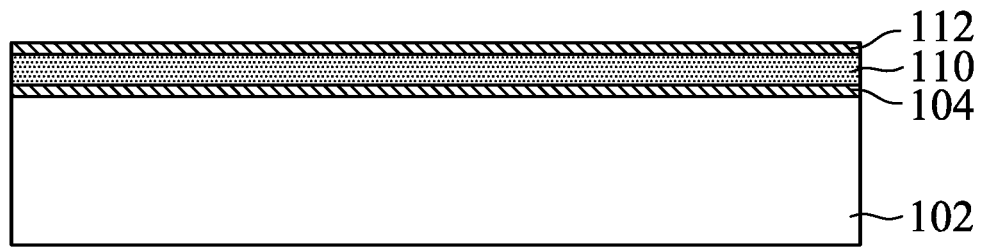

Still referring to FIG. 1A, an ion implantation process 115 is performed to implant an impurity comprising $N_2$ into the surface of the first polysilicon layer 110. As shown in FIG. 1B, after the ion implantation process 115 is performed, an $N_2$-doped thin layer 112 is formed on the surface of the first polysilicon layer 110. The ion source used in the ion implantation process 115 may have a high content of $N_2^+$ ions. In some embodiments, the ion source used in the ion implantation process 115 is an $N_2^+$ ion having a concentration that is equal to or greater than 99%. Therefore, it is advantageous to improve the threshold voltage of the non-volatile memory, and the reliability and durability of the device may be significantly improved. In other embodiments, the ion source used in the ion implantation process 115 is an $N_2^+$ ion having a concentration that is equal to or more than 99.9% or substantially 100%. The ion source having a high content of $N_2^+$ ions may be produced by any applicable methods. For example, nitrogen gas may be ionized in the ionizer to produce ions having different mass/charge ratios (m/e). Then, the ions are separated from each other by an electric field or a magnetic field, and the $N_2^+$ ions are focused to form an ion beam which may be used as an ion source for the ion implantation process 115. In one embodiment, when the ion implantation process 115 is performed, the ion implantation apparatus may provide secondary electrons which have equal amounts of charge to neutralize the positively charged ion beam, and then, apply the ion beam onto the wafer. Therefore, the damage of the wafer caused by the accumulation of the positive ions in the wafer may be prevented. It should be realized that the above-described methods are merely examples and are not intended to limit the invention.

Figure 1C:
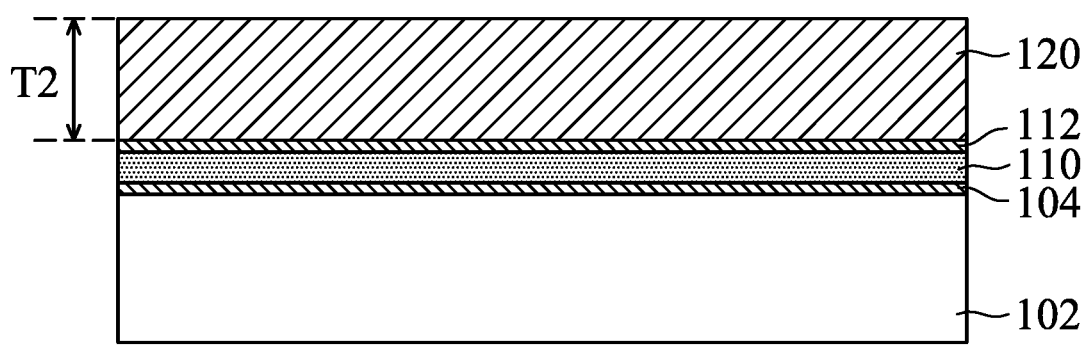

Then, as shown in FIG. 1C, a second deposition process is performed to form a second polysilicon layer 120 on the first polysilicon layer 110 and the $N_2$-doped thin layer 112. In some embodiments, the second polysilicon layer 120 may be a polysilicon layer doped with a dopant. In some embodiments, the second polysilicon layer 120 may be a polysilicon layer doped with an N-type dopant. In some embodiments, the N-type dopant may include phosphorus or arsenic.

The second deposition process may include a CVD process, an ALD process, other applicable deposition process, or a combination thereof. In some embodiments, the second deposition process may be a low pressure chemical vapor deposition performed in a furnace, and the second deposition process may include an in-situ doping process. As a result, the polysilicon layer may be deposited and doped with the dopant simultaneously to form the doped second polysilicon layer 120. In some embodiments, in order to dope phosphorus into the second polysilicon layer 120, phosphine ($PH_3$) is used as the dopant gas of the in-situ doping process.

In some embodiments, the thickness T2 of the second polysilicon layer 120 is 20-200 nm. In preferable embodiments, the thickness T2 of the second polysilicon layer 120 is greater than the thickness T1 of the first polysilicon layer 110. In a preferable embodiment, the thickness T2 of the second polysilicon layer 120 is at least twice as large as the thickness T1 of the first polysilicon layer 110.

Figure 1D:
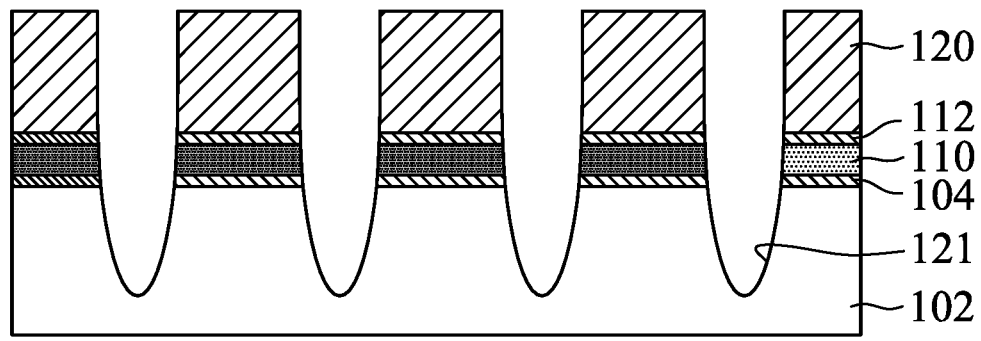

Then, as shown in FIG. 1D, a first etching process is performed to form a plurality of first trenches 121 through the second polysilicon layer 120, the $N_2$-doped thin layer 112, the first polysilicon layer 110, the tunneling oxide layer 104, and the substrate 102. The first etching process may include a plasma etching process, reactive ion etching (RIE) process, other applicable etching processes, or a combination thereof. In some embodiments, in order to form the first trench 121 having a higher aspect ratio, the first etching process is reactive ion etching process Referring to FIG. 1E, insulating material is formed in the first trenches 121, and a second etching process is performed to remove a portion of the insulating material. Accordingly, isolation structures 122 are formed in the first trenches 121, and second trenches 123 are formed on the isolation structures 122. A plurality of floating gates may be isolated from one another by these isolation structures 122.

Figure 1E:
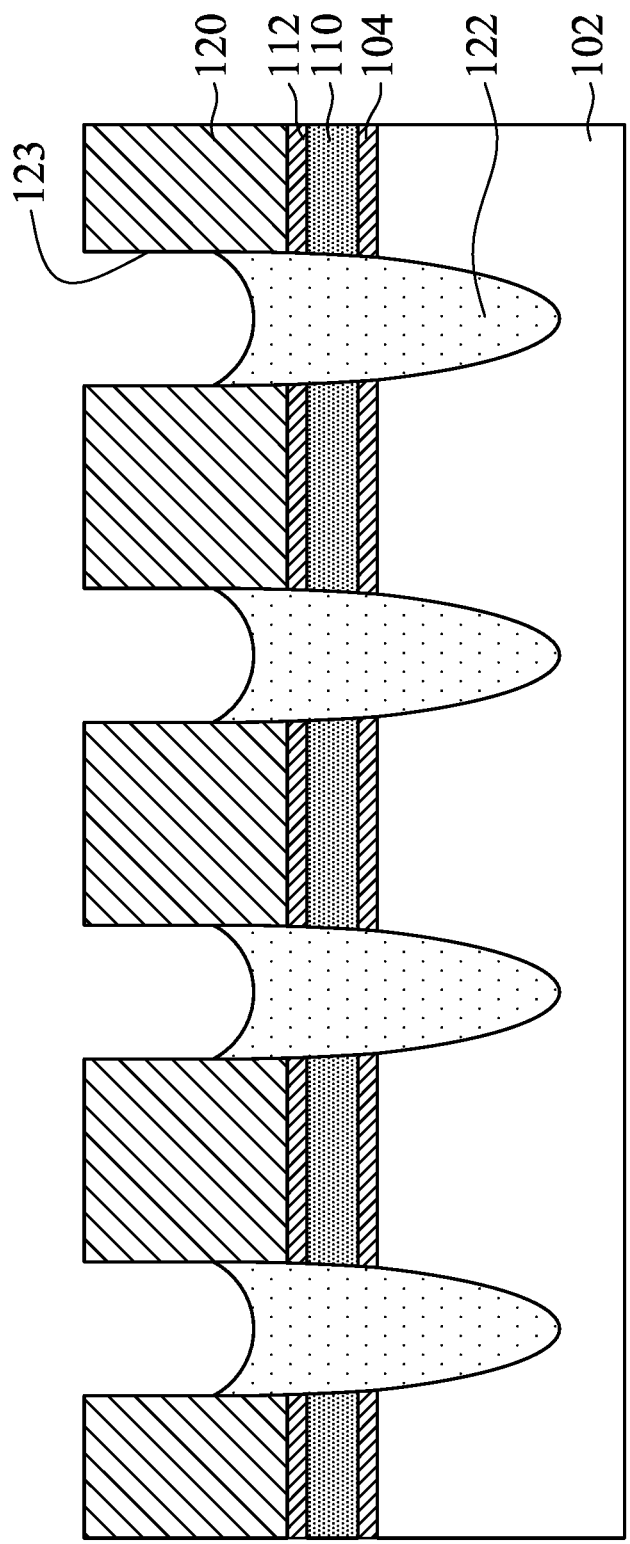

The isolation structure 122 having a single layer structure is shown in FIG. 1E. However, it should be realized that the embodiments are merely for the purpose of simplicity, and are not intended to limit the invention. In other words, the isolation structure 122 may be a single layer structure or a multi-layer structure. Furthermore, the isolation structure 122 may include silicon nitride, silicon oxide, silicon oxynitride, other applicable insulating materials, or a combination thereof.

Further, a liner (not shown) may be formed on the inner wall of the first trench 121 before forming the insulating material in the first trench 121. In some embodiments, an oxide liner may be formed by a high-temperature thermal oxidation process. In such embodiments, the second polysilicon layer 120 experienced the high-temperature thermal oxidation process may include a plurality of second polysilicon grains each having a second grain size greater than a first grain size of each of first polysilicon grains in the first polysilicon layer 110.

It should be noted that after absorbing the heat energy in the high-temperature process, the phosphorous dopant in the second polysilicon layer 120 may be converted into a gaseous state and outgas outward easily. As a result, the concentration of phosphorus dopant may be decreased, and the electrical resistance value of the second polysilicon layer 120 may be increased. On the other hand, since the nitrogen dopant is formed in the first polysilicon layer 110 of the invention, the electrical resistance value of the first polysilicon layer 110 is increased. In addition, when the swollen phosphorus dopant outgas outward after absorbing the heat energy, the hills-like protrusions may be left on the surface of the second polysilicon layer 120, and an uneven surface may be left. As a result, the yield of the product may be decreased. In particular, the impact on miniaturized device will become more serious. In order to reduce the whole electrical resistance value of the floating gate, the doping dose of the phosphorus dopant may be increased. However, if the doping dose of the phosphorus dopant is increased, the problem of the above-mentioned protrusions may become more serious.

Figure 1F:
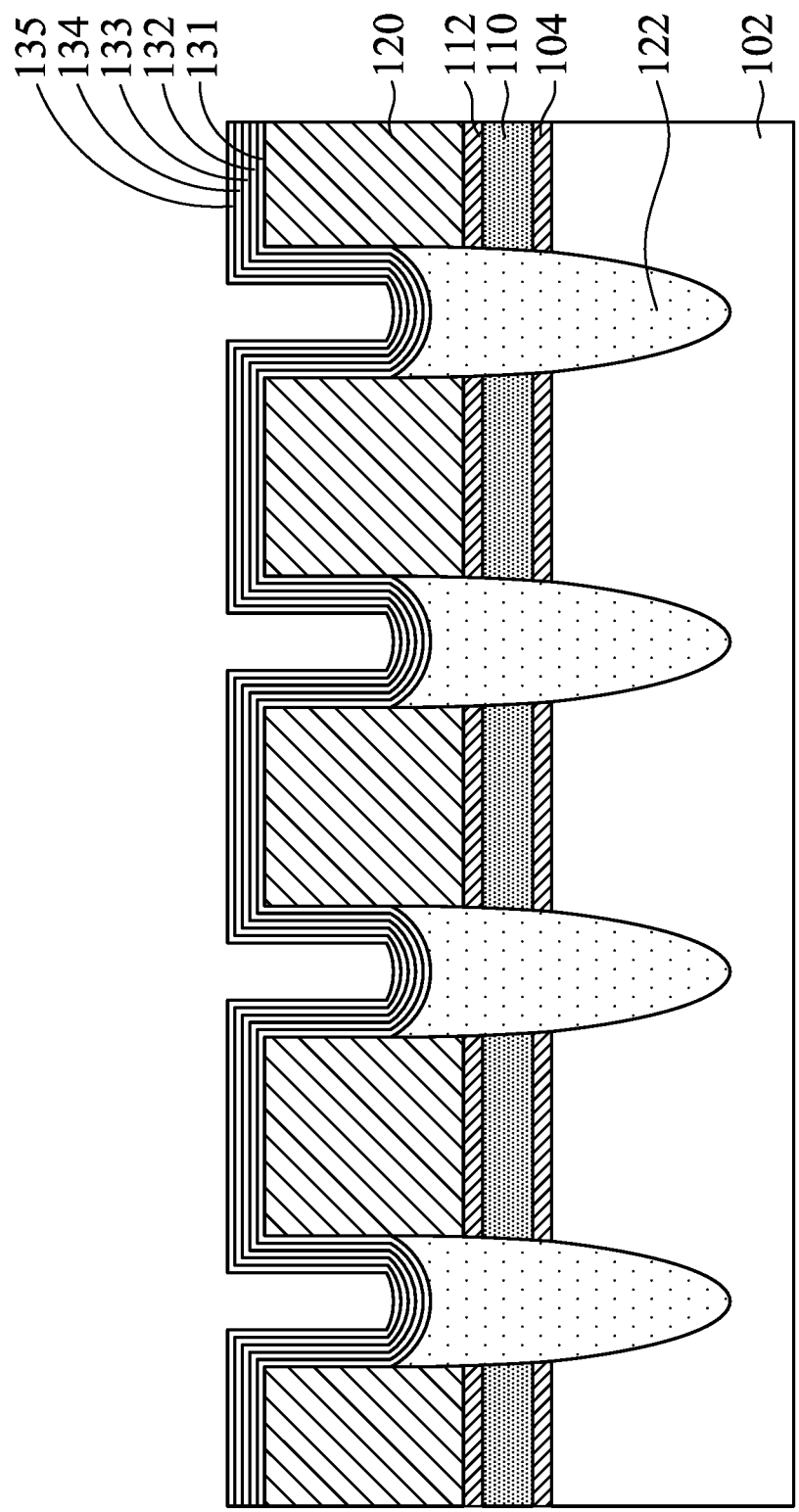

In order to solve the above problems, as shown in FIG. 1F, after the formation of the isolation structure 122, a first nitrogen gas plasma treatment is performed at room temperature to conformally form a first nitride film 131 on the surface of the second polysilicon layer 120 and the surface of the isolation structure 122.

In the invention, by forming the first nitride film 131 at room temperature, the probability of outward outgassing of the phosphorus dopant may be remarkably reduced. Furthermore, even if the phosphorous dopant outgassed outward, the first nitride film 131 may block the outgassing of the phosphorus dopant, and most of the phosphorus dopant may be kept in the second polysilicon layer 120. Therefore, if the first nitride film 131 is formed, the electrical resistance value of the second polysilicon layer 120 may be prevented from rising after the high-temperature process even if the doping dose of the phosphorus dopant is not increased.

In order to effectively block the outgassing of the phosphorus dopant, the thickness of the first nitride film 131 may be 1-5 Å (angstrom).

After the first nitride film 131 is formed, a three-layer structure consisting of an oxide layer 132, a nitride layer 133 and an oxide layer 134 is sequentially and conformally formed on the first nitride film 131. The three-layer structure may be formed by using any applicable material or deposition process, such as, a high-temperature furnace process. In some embodiments, the oxide layer 132 and the oxide layer 134 may include silicon oxide.

Then, a second nitrogen gas plasma treatment is performed to conformally form a second nitride film 135 on the surface of the oxide layer 134. The second nitrogen gas plasma treatment may be the same as or similar to the first nitrogen gas plasma treatment, and the second nitride film 135 may be the same as or similar to the first nitride film 131. Therefore, the details will not be repeated here.

In some embodiments, in order to block the diffusion of the phosphorus dopant, the first nitride film 131 and the second nitride film 135 are formed below and above the three-layer structure, respectively. Therefore, the second polysilicon layer 120 may be maintained at a stable electrical resistance value, and the variation of the threshold voltage may be reduced.

Furthermore, the first nitride film 131 and the second nitride film 135 may reduce the equivalent oxide thickness (EOT). Therefore, a lower voltage is required for programming/erasing. In other words, the threshold voltage may be reduced, and the durability of the non-volatile memory device may be improved.

In addition, a portion closer to the edge of the tunneling oxide layer 104 may be re-oxidized (also known as the bird's beak effect) in the subsequent heat treatment, thereby the tunneling oxide layer 104 may become thicker. The first nitride film 131 and the second nitride film 135 may prevent the bird's beak effect, and therefore, the operating voltage distribution of the non-volatile memory device may be more uniform.

In order to improve the reliability and durability of the non-volatile memory device, the thickness of the second nitride film 135 may be 1-5 Å.

Figure 1G:
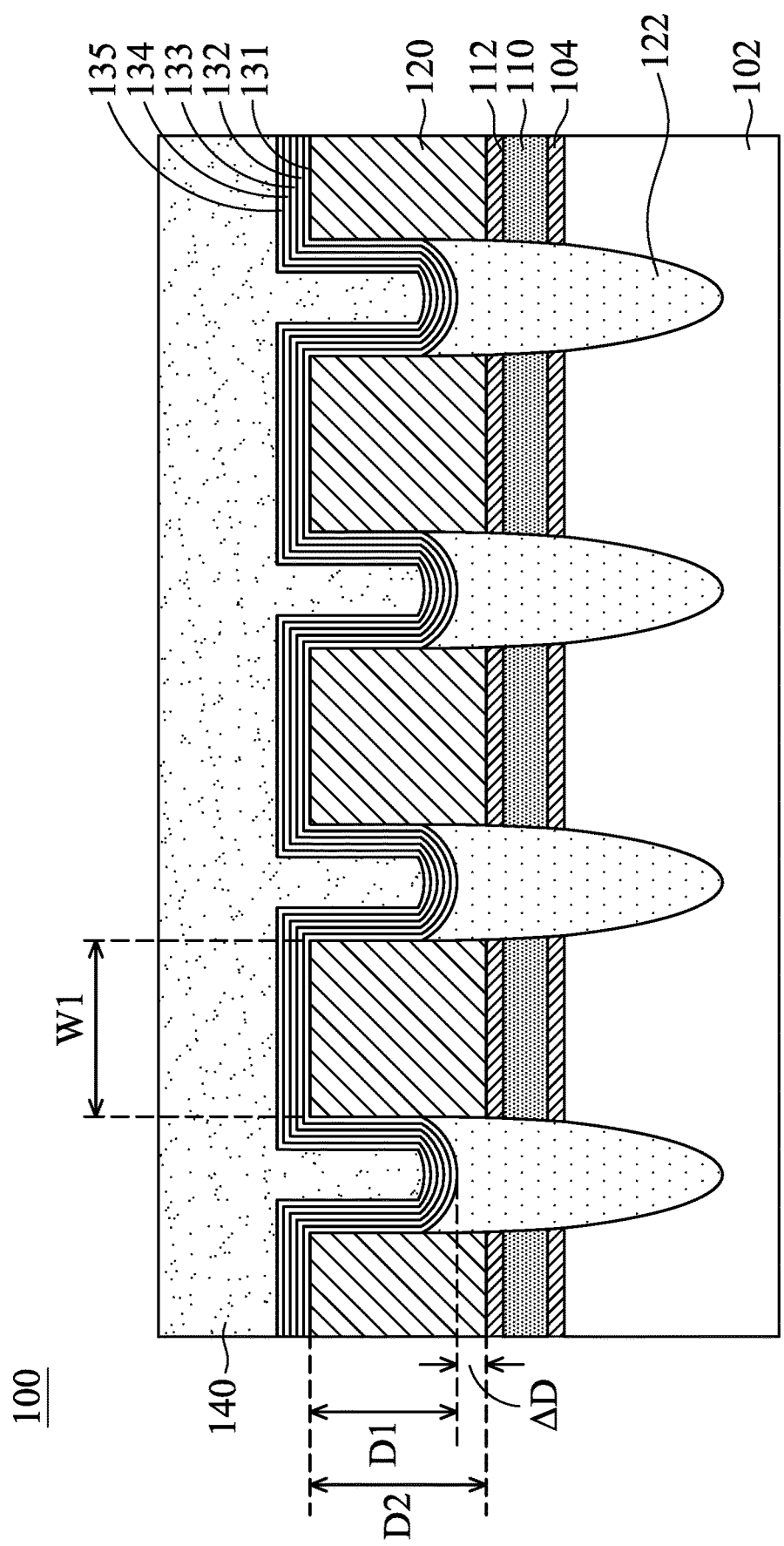

Then, as shown in FIG. 1G the polysilicon material 140 is deposited on the second nitride film 135 and filled into the second trench 123. After the polysilicon material 140 is formed, other conventional processes (e.g., patterning the polysilicon material 140 to form a control gate) may be performed to accomplish the non-volatile memory devices 100. The details of the conventional processes will not be described here.

Referring to FIG. 1G the non-volatile memory device 100 of the invention may include a substrate 102, a tunneling oxide layer 104, a floating gate, a dielectric layer, and a control gate. The tunneling oxide layer 104 is disposed on the substrate 102. The floating gate is disposed on the tunneling oxide layer 104 and includes a first polysilicon layer 110, a second polysilicon layer 120, and a nitrogen dopant. The second polysilicon layer 120 includes a dopant. The dielectric layer includes a five-layer structure that is conformally formed on and covers the floating gate. The five-layer structure includes a first nitride film 131, an oxide layer 132, a nitride layer 133, an oxide layer 134, and a second nitride film 135. The control gate is disposed on the dielectric layer.

The first polysilicon layer 110 includes a plurality of first polysilicon grains having a first grain size. The second polysilicon layer 120 includes a plurality of second polysilicon grains having a second grain size. The second grain size is greater than the first grain size. The nitrogen dopant is formed and in interstices between the plurality of first polysilicon grains of the first polysilicon layer.

If the first grain size is too large, the interstices between the first polysilicon grains are so large that the dopant in the second polysilicon layer 120 is easily moved to be in interstices between the first polysilicon grains. As a result, the variation of the threshold voltage of the non-volatile memory device 100 is increased, and the reliability and durability of the device are decreased. In some embodiments, the first grain size is 1-70 nm. In some embodiments, the first grain size is 3-40 nm.

In the invention, a non-silicon dopant (e.g., nitrogen) is doped on the surface of the first polysilicon layer 110. Without these dopants, the grains of the first polysilicon layer may be bonded together during the subsequent heat treatment process, thereby increasing the grain size of the grains. In contrast, due to these dopants between the grains, the bonding of the grains during the heat treatment process becomes more difficult or even does not occur. That is, because of the ion implantation process 115 of the invention, the grain size of the first polysilicon layer 110 may be prevented from being significantly affected by the heat treatment process. Therefore, the first grain size is smaller than the second grain size.

If the nitrogen dopant is doped into the surface of the first polysilicon layer 110 by conventional nitrogen gas plasma, it is possible to avoid the increase in the grain size of the first polysilicon layer 110 due to the heat treatment process. However, the amount of the N-type dopant (e.g., phosphorus) diffusing from the second polysilicon layer 120 to the first polysilicon layer 110 cannot be significantly reduced. In this case, these phosphorus dopants will gather in the interstices between the grains of the first polysilicon layer 110 or in the interstice between the first polysilicon layer 110 and the tunneling oxide layer. Furthermore, the phosphorus dopant diffused into the first polysilicon layer 110 may further diffuse into the substrate 102. As a result, the conductivity of some areas will be increased abnormally, and the problem of over programming and/or over erasing may occur.

After several methods have been tried, the inventors of the invention have found that the problem of over programming and/or over erasing may be improved by using a high content of $N_2^+$ ion as an ion source for ion implantation process. Therefore, the threshold voltage of the non-volatile memory device 100 may be improved, and the reliability and durability of the device may be significantly improved.

The reasons of why $N_2^+$ ions can improve the problem of over programming and/or over erasing will be discussed in the following paragraphs. The $N_2^+$ ion is a monovalent cation formed by two nitrogen atoms. On the other hand, the $N^+$ ion is a monovalent cation formed by one nitrogen atom. The mass of the $N_2^+$ ion is relatively larger than the mass of the $N^+$ ion. Therefore, in the first polysilicon layer 110, the diffusion or movement of the neutralized dopant $N_2$ is more difficult, and the neutralized dopant $N_2$ may concentrate at the surface of the first polysilicon layer 110 and form a layer containing a high concentration of $N_2$ (for example, the $N_2$-doped thin layer 112). Because of the $N_2$-doped thin layer 112, it is possible to prevent the grain size of the grains of the first polysilicon layer 110 from being affected after the heat treatment process, and the diffusion of the phosphorus dopant may be blocked more effectively. In other words, the $N_2$-doped thin layer 112 may significantly reduce the amount of phosphorus dopant entering the first polysilicon layer 110. Therefore, the above-mentioned problem of over programming and/or over erasing may be significantly reduced or solved.

In contrast, if nitrogen is doped onto the surface of the first polysilicon layer 110 by nitrogen gas treatment, the species of nitrogen having lower mass (e.g., $N^+$, $N^-$, $N^*$ and N atom) will diffuse or move to a deeper position in the first polysilicon layer 110. Therefore, the nitrogen dopant cannot concentrate at the surface of the first polysilicon layer 110, and the concentration of nitrogen dopant at the surface of the first polysilicon layer 110 may become lower. As a result, the ability of the first polysilicon layer 110 to block the diffusion of the phosphorus dopant is poor, and the problem of over programming and/or over erasing may not be effectively improved.

Figure 3A:
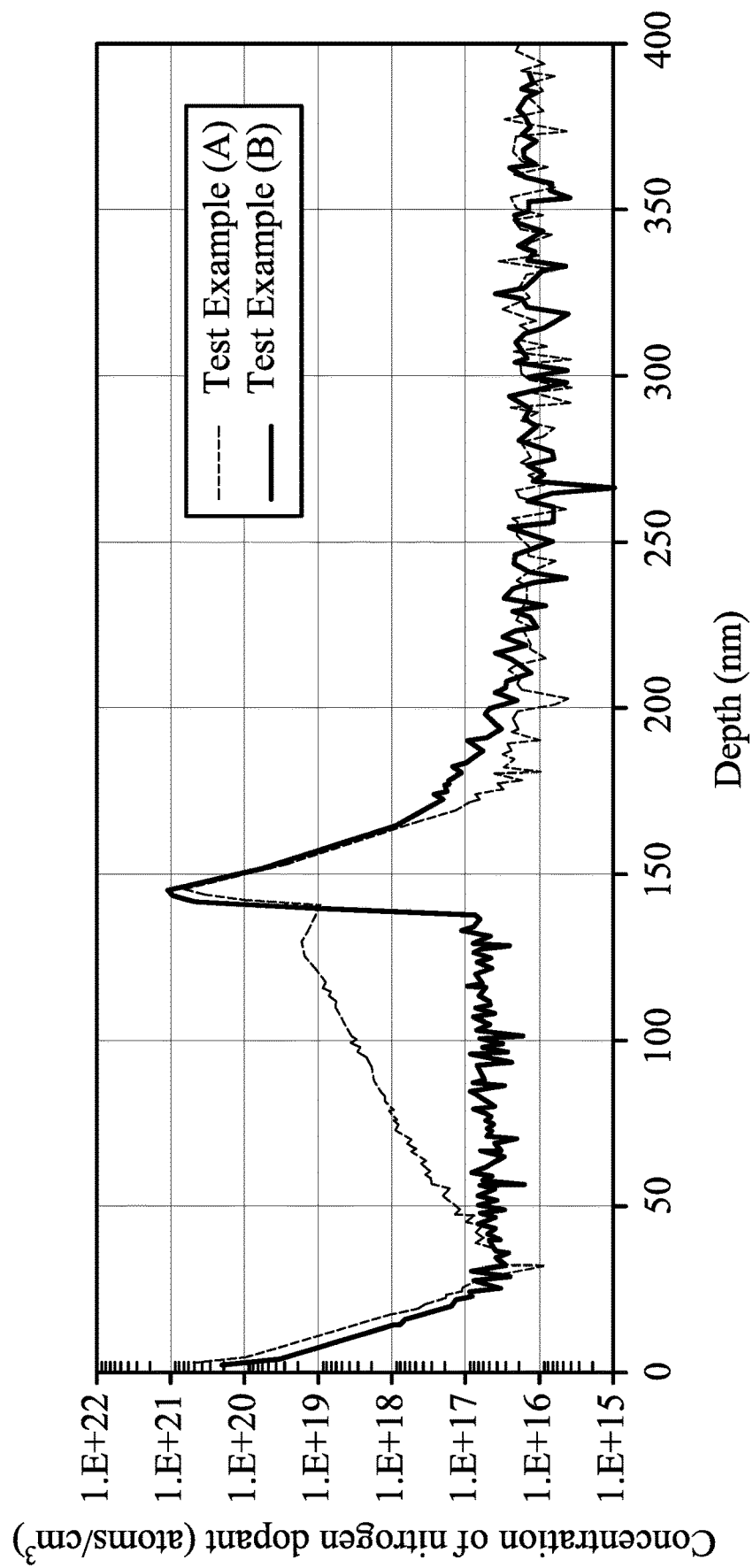
FIGS. 3A-3B show the experimental results of the concentration profiles of the dopants of the non-volatile memory devices in Test Example (A) and Test Example (B)
Figure 3B:
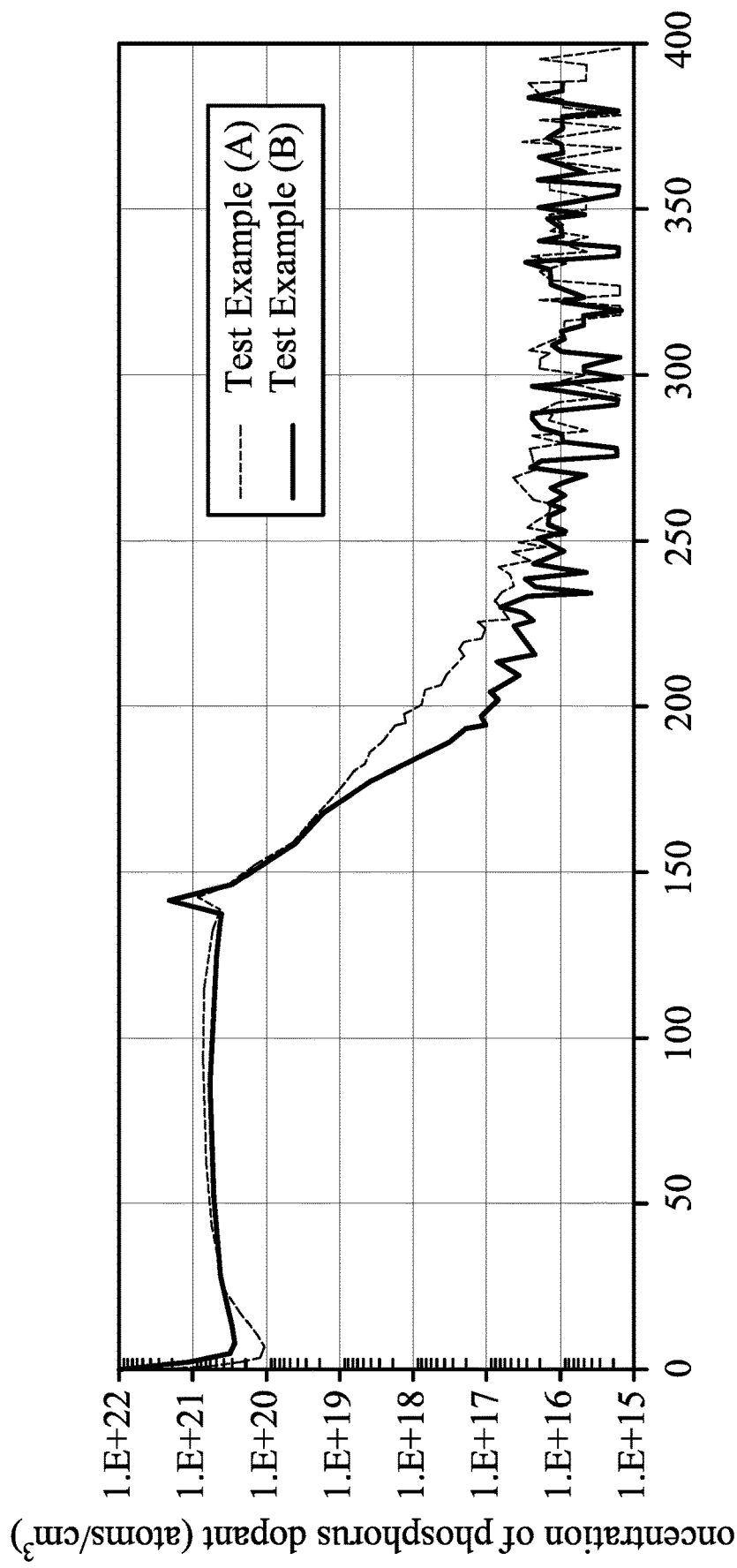

In order to verify the above-mentioned deduction, the inventors of the invention have conducted experiments and the results are shown in FIGS. 3A-3B. FIGS. 3A-3B show the experimental results of the concentration profiles of the dopants of the non-volatile memory devices in Test Example (A) and Test Example (B).

The manufacturing process of Test Example (A) includes: an ion implantation process is performed on a silicon substrate by using $N^+$ ions as an ion source; then, a phosphorus-doped polysilicon layer having a thickness of 150 nm is deposited on the silicon substrate; then, a high-temperature annealing process is performed at 1050° C. and under nitrogen gas environment. The manufacturing process of Test Example (B) is the same as that of Test Example (A), except that the ion implantation process of Test Example (B) is performed by using $N_2^+$ ions as the ion source. Test Example (A) and Test Example (B) were analyzed by secondary ion mass spectrometry (SIMS). The concentration profiles of the nitrogen dopant is shown in FIG. 3A, and the concentration profiles of the phosphorus dopant is shown in FIG. 3B.

Referring to FIG. 3A, the concentration of nitrogen dopant (N) in Test Example (A) had a peak at the depth of about 150 nm, which represents that the dopant N was concentrated at the interface between the silicon substrate and the polysilicon layer. However, the nitrogen dopant of Test Example (A) had a severe tailing phenomenon in the region having a depth of about 50 to 150 nm, which represents that the dopant N was driven by the stress of the growth of the grains in the polysilicon layer after the heat treatment, so that a lot of the dopant N diffused into the polysilicon layer. On the other hand, the concentration of nitrogen dopant ($N_2$) in Test Example (B) had a peak at a depth of about 150 nm, and the variation of the dopant $N_2$ concentration before and after this peak was extremely small, which represents that the dopant $N_2$ was concentrated at the interface between the silicon substrate and the polysilicon layer and hardly diffused to the polysilicon layer. In other words, the above-mentioned tailing phenomenon may be avoided by using $N_2$ as the nitrogen dopant.

Referring to FIG. 3B, at a depth of about 200 nm, the concentration of phosphorus dopant in Test Example (A) was about $10^{18}$ atoms/cm$^3$, and the concentration of phosphorus dopant in Test Example (B) was about $10^{17}$ atoms/cm$^3$. Furthermore, the concentration of phosphorus in Test Example (A) was significantly higher than that in Test Example (B) in the region having the depth of about 170-220 nm, which represents that compared with nitrogen dopant (N), the diffusion of phosphorus dopant may be more effectively blocked by using $N_2$ as the nitrogen dopant.

From the above experimental results, it can be realized that when $N^+$ ions are used as the nitrogen dopant in the ion implantation process 115, the nitrogen dopant may be attracted by the stress of the growth of the grains in the polysilicon layer thereon. Therefore, the above-mentioned tailing phenomenon of the nitrogen dopant may easily occur in the second polysilicon layer. That is, the concentration of nitrogen dopant at different depth ranges may be significantly uneven. Since the nitrogen dopant can inhibit the growth of polysilicon grains, if the concentration of nitrogen dopant is higher, the grain size of polysilicon will be smaller. Therefore, the above-mentioned tailing phenomenon of the nitrogen dopant may cause the grain size of the second polysilicon layer to become uneven. That is, the variability of the grain size may be increased.

In contrast, performing the ion implantation process by using $N_2^+$ ions as the ion source may significantly reduce the amount of the phosphorus dopant entering the first polysilicon layer 110. Therefore, the problem of over programming and/or over erasing may be significantly improved or solved. Accordingly, the threshold voltage of the non-volatile memory device 100 may be improved, and the reliability and durability of the device may be significantly improved.

Figure 4:
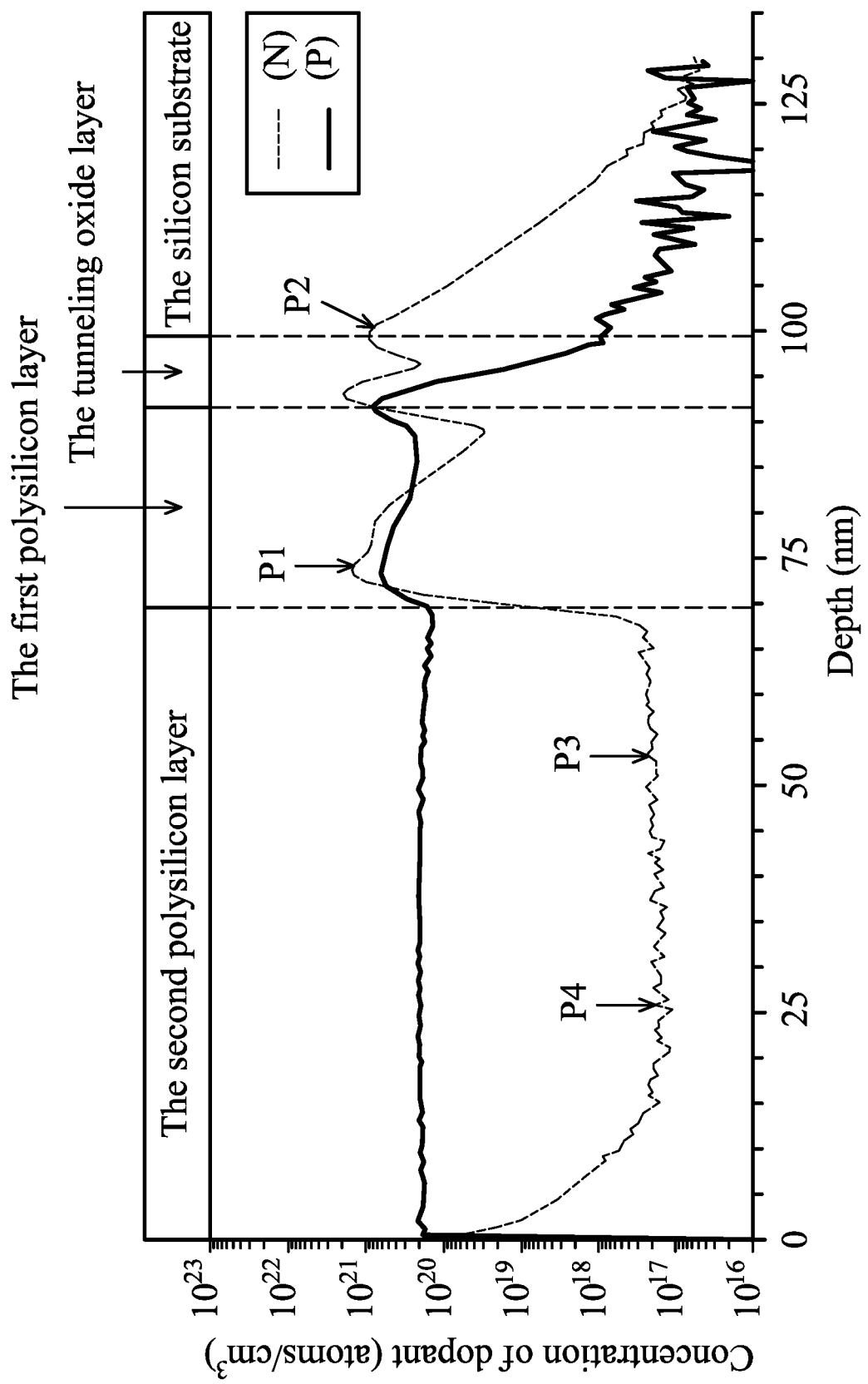
FIG. 4 shows the experimental results of the concentration profiles of the dopants of the non-volatile memory device in Test Example (C)

Furthermore, in order to verify that the phosphorous dopant can be further blocked by doping the nitrogen dopant in the tunneling oxide layer 104 and the substrate 102, the inventors have conducted experiments and the results are shown in FIG. 4. FIG. 4 shows the experimental results of the concentration profiles of the dopants of the non-volatile memory device in Test Example (C).

Test Example (C) includes the structure as shown in FIG. 1C and is manufactured in accordance with the above-mentioned steps described in FIGS. 1A to 1C. The nitrogen gas plasma treatment and the high-temperature annealing process are performed after the formation of the tunneling oxide layer 104. FIG. 4 shows the concentration profiles of the nitrogen dopant and the phosphorus dopant in Test Example (C) analyzed by SIMS. In FIG. 4, the dotted line represents the concentration profile of the nitrogen dopant, and the solid line represents the concentration profile of the phosphorus dopant.

As shown in FIG. 4, the concentration profile of the nitrogen dopant includes the first peak P1, the second peak P2, the third peak P3, and the fourth peak P4. The first peak P1 was located in the first polysilicon layer 110. The second peak P2 was located in the substrate 102. The third peak P3 and the fourth peak P4 were located in the second polysilicon layer 120.

Referring to FIG. 4, the first peak P1 was located at the position of the surface of the first polysilicon layer 110, and the concentration of nitrogen dopant at the first peak P1 was significantly higher than the concentration of nitrogen dopant at the third peak P3, which represents that most of the nitrogen dopant $N_2$ was kept near the interface of the first polysilicon layer 110 and the second polysilicon layer 120, and only a very small amount of nitrogen dopant entered the second polysilicon layer 120. The third peaks P3 and the fourth peaks P4 were located at different depths in the second polysilicon layer 120. The concentration of nitrogen dopant at the third peak P3 is very close to the concentration of nitrogen dopant at the fourth peak P4, which represents that the above-mentioned tailing phenomenon of the nitrogen dopant entering the second polysilicon layer 120 did not occur.

Referring to FIG. 4, because the above-mentioned nitrogen gas plasma treatment and the above-mentioned annealing process were performed, the concentration profile of the nitrogen dopant had a second peak P2 in the substrate 102 and another peak in the tunneling oxide layer 104 (not marked). The concentration of nitrogen dopant at the second peak P2 is close to the concentration of nitrogen dopant at the first peak P1.

Still referring to FIG. 4, the concentration profile of the phosphorus dopant dropped sharply in the tunneling oxide layer 104 and continued decreasing in the substrate 102. It has been verified that if a high concentration of nitrogen dopant is present in the tunneling oxide layer 104 and the substrate 102, the phosphorus dopant may be further blocked to prevent the phosphorus dopant from entering the tunneling oxide layer 104 and the substrate 102. Accordingly, the threshold voltage, the reliability and the durability of the non-volatile memory device 100 may be further improved.

In some embodiments, in the non-volatile memory device 100 of the invention, the concentration of nitrogen dopant at the third peak P3 is not greater than the concentration of nitrogen dopant at the first peak P1 and the concentration of nitrogen dopant at the second peak P2. Therefore, the problem of over programming and/or over erasing may be improved or solved. As a result, the threshold voltage of the non-volatile memory device 100 may be improved, and the reliability and durability of the device may be significantly improved.

In some embodiments, in the non-volatile memory device 100 of the invention, the value of the concentration of nitrogen dopant at the second peak P2 divided by the concentration of nitrogen dopant at the third peak P3 is in a range of $10^2$-$10^5$. Therefore, the phosphorus dopant may be prevented from entering the tunneling oxide layer 104 and the substrate 102. As a result, the first nitride film 131 of the non-volatile memory device 100 of the invention may be used as a cap layer or a barrier layer to block the outgassing of the phosphorous dopant in the second polysilicon layer 120 after the high-temperature process. In some embodiments, the nitrogen concentration of first nitride film is $10^{21}$-$10^{23}$ atoms/cm$^3$. In some embodiments, the concentration of phosphorus dopant in the second polysilicon layer 120 is $10^{20}$-$10^{22}$ atoms/cm$^3$.

In some embodiments, in the non-volatile memory device 100 of the invention, the value of the concentration of nitrogen dopant at the fourth peak P4 divided by the concentration of nitrogen dopant at the third peak P3 is not greater than 1. Therefore, the uniformity of the grain size of the second polysilicon layer is increased.

For two separated floating gates, because the volume (or the number) of the interstice between the first polysilicon grain may be different, the concentrations of the nitrogen dopant and the electrical resistance values may be different. For example, if the grain size of the first polysilicon grain is greater than the width of the floating gate, there may be no interstice between the grains in the first polysilicon layer 110 of some floating gates. Such a floating gate may have a lower concentration of nitrogen dopant and a lower resistance. In other words, there may be uncontrollable differences in these floating gates. As a result, the yield and reliability of the non-volatile memory device 100 may be reduced. With the miniaturization of memory devices, this problem may become more serious.

In order to improve the above-mentioned problems, in the non-volatile memory device 100 of the invention, the relative relationship between the first grain size and the width of the floating gate may be controlled as needed. As shown in FIG. 1G the width of the floating gate is represented by W1. In some embodiments, the ratio of the first grain size to the width W1 of the floating gate is 0.05-0.95. In some embodiments, the ratio of the first grain size to the width W1 of the floating gate is 0.35-0.75.

In addition, in order to further improve the performance of the non-volatile memory device 100, the depth of the first nitride film 131 of the non-volatile memory device 100 of the invention may be controlled within a specific range.

In some embodiments, as shown in FIG. 1G the maximum depth of the first nitride film 131 is D1, the depth of the top surface of the first polysilicon layer 110 is the second depth D2, and the difference value of the second depth D2 minus the maximum depth D1 is ΔD. In some embodiments, ΔD is a positive value, i.e., the lowest portion of the first nitride film 131 is higher than the top surface of the first polysilicon layer 110. If the value of the maximum depth D1 is too large, the first nitride film 131 is too close to the tunneling oxide layer 104. As a result, it is highly probable that the problem of over programming will occur. On the other hand, if the value of the maximum depth D1 is too small, the second trench 123 is too shallow and ΔD is too large. As a result, it is highly probable that the problem of over erasing will occur. Accordingly, the variation of the threshold voltage of the non-volatile memory device 100 may be increased, and the reliability and durability of the device may be decreased. With the miniaturization of memory devices, these problems may become more serious.

In order to address the above-mentioned problems, the relative relationship between the depth of the first nitride film 131 and the depth of the top surface of the first polysilicon layer 110 may be controlled as needed. In some embodiments, the difference value ΔD is 5-50 nm. In some embodiments, the difference value ΔD is 10-30 nm.

Figure 5:
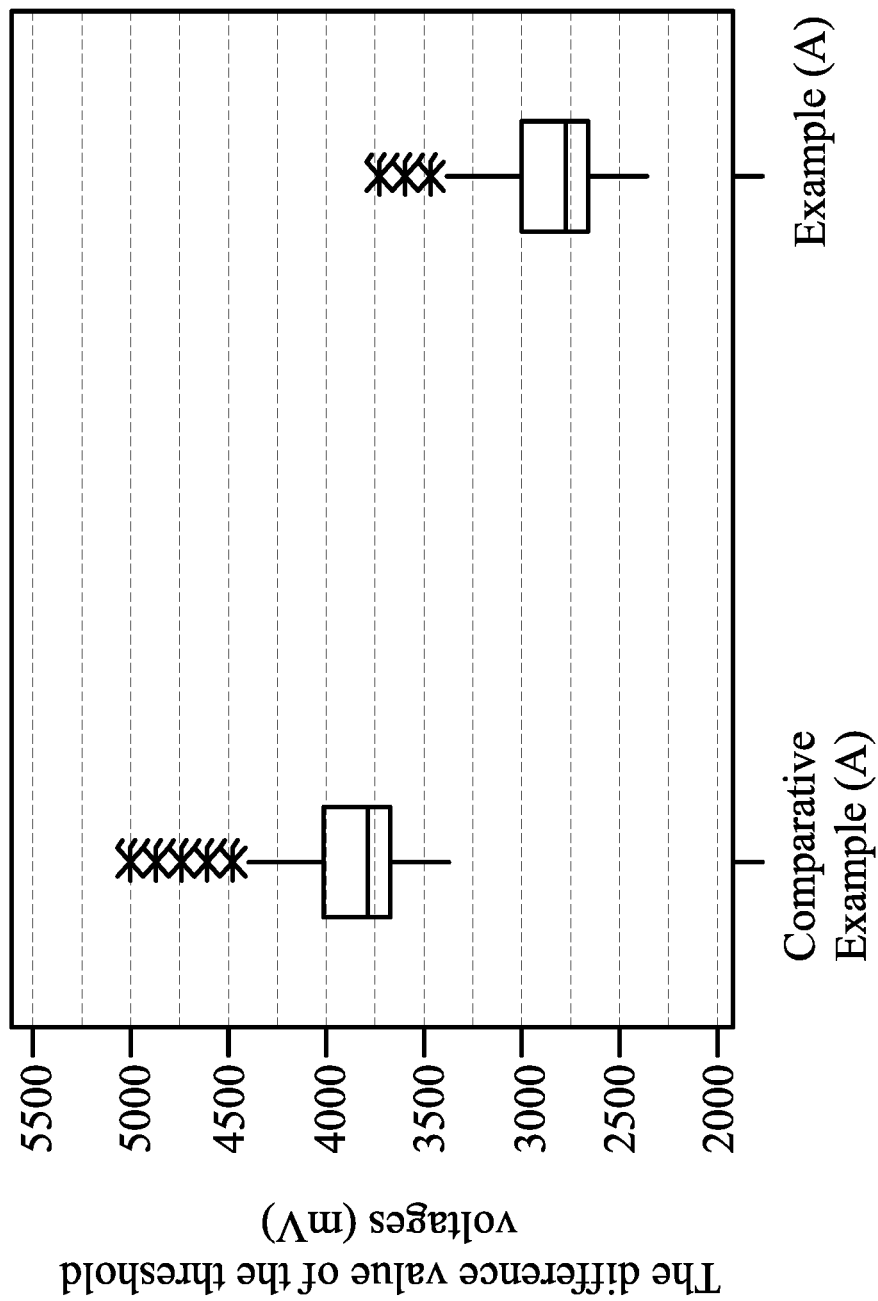
FIG. 5 shows the experimental results of the difference value of the threshold voltages of the non-volatile memory devices in Comparative Example (A) and Example (A).

In order to further verify the advantages of the first nitride film, the second nitride film and the implantation of $N_2^+$ ions, the inventors of the invention have conducted experiments. FIG. 5 shows the experimental results of the variations of the threshold voltages of the non-volatile memory devices in Comparative Example (A) and Example (A).

Example (A) is a non-volatile memory device manufactured in accordance with the above-mentioned steps described in the FIGS. 1A to 1G and the resulting non-volatile memory device includes a structure as shown in FIG. 1G The non-volatile memory device of Comparative Example (A) was manufactured in accordance with a procedure similar to that of Example (A), except that Comparative Example (A) did not carry out an $N_2^+$ ion implantation and did not form a first nitride film and a second nitride film. The non-volatile memory devices of Example (A) and Comparative Example (A) were subjected to programming/erasing operations for $10^5$ cycles, and the threshold voltage was measured. The difference value between the maximum value and the minimum value of the threshold voltage (hereinafter referred to as the difference value of the threshold voltages) is shown in FIG. 5.

In FIG. 5, if the difference value of the threshold voltages is larger, the variation of the threshold voltage is larger. In other words, the reliability of the non-volatile memory device is worse. On the other hand, if the average difference value of the threshold voltages exceeds 3000 mV, it represents that the device failed the durability test.

Referring to FIG. 5, the average difference value of the threshold voltage was about 3800 mV for the non-volatile memory device of Comparative Example (A). That is, the device failed the durability test. The average difference value of threshold voltage was about 2800 mV for the non-volatile memory device of Example (A). That is, the device passed the durability test.

From the above experimental results, it has been verified that the problems of over programming and over erasing may be significantly improved or solved in the non-volatile memory device 100 of the invention. Therefore, the threshold voltage of the non-volatile memory device may be improved, and the reliability and durability of the device may be significantly improved.

Figure 2:
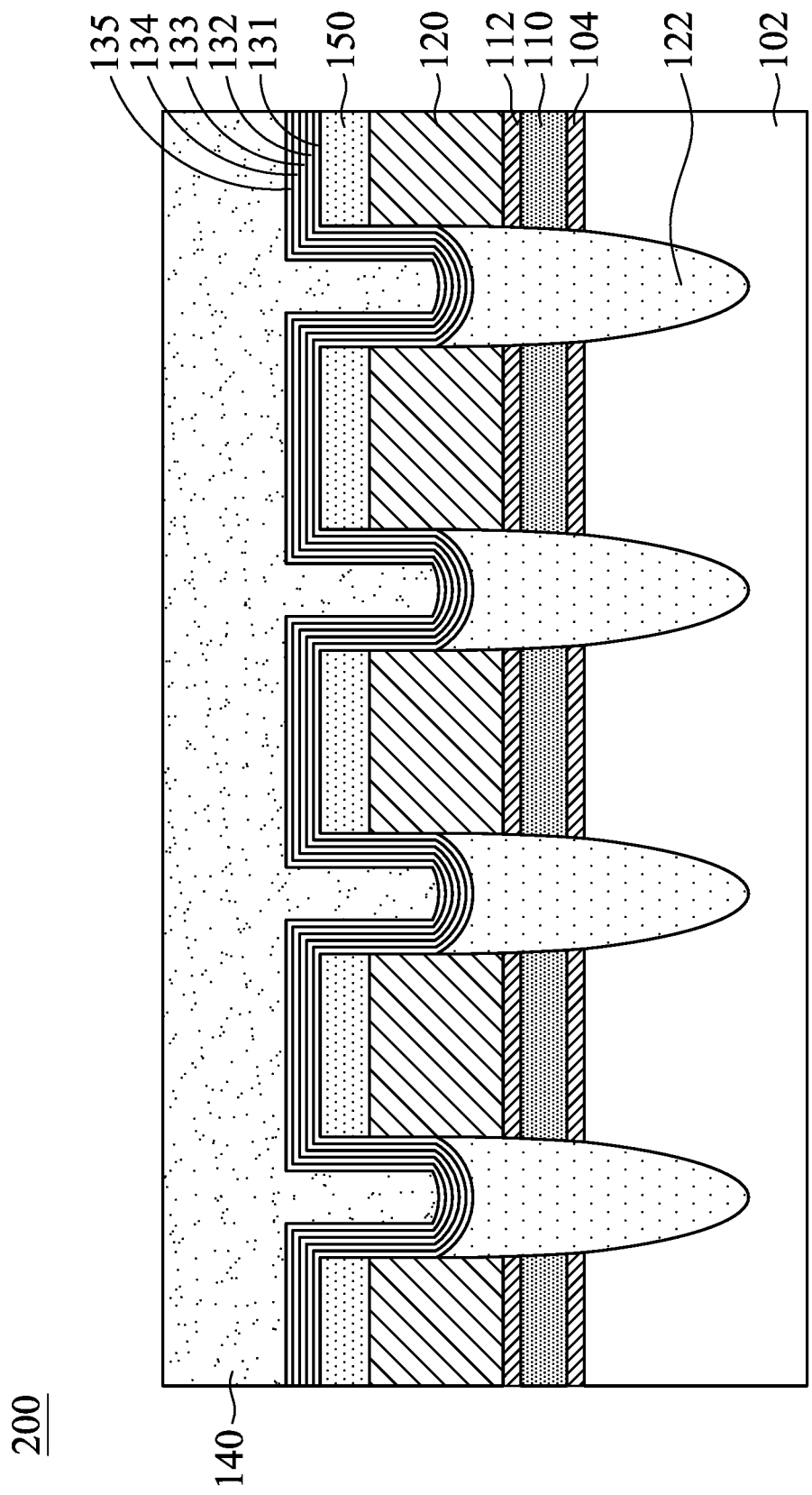
FIG. 2 shows a cross-sectional view of a non-volatile memory device in accordance with other embodiments.

FIG. 2 shows a cross-sectional view of a non-volatile memory device 200 in accordance with other embodiments. FIG. 2 is similar to FIG. 1G, except that the third polysilicon layer 150 is formed on the second polysilicon layer 120 before the first nitride thin film 131 is formed. The same elements as those in FIG. 1 are denoted by the same reference numerals. For the sake of simplicity of explanation, the elements which are the same as or similar to those in FIG. 1 are not repeated here.

In some embodiments, the supply of the dopant gas may be discontinued after the formation of the doped second polysilicon layer 120, and the in-situ deposition process (i.e., the third deposition process) may be continued to form the undoped third polysilicon layer 150 on the second polysilicon layer 120.

Because the third polysilicon layer 150 has no dopant (e.g., a phosphorous dopant), the third polysilicon layer 150 may also serve as a cap layer or a barrier layer to block the outgassing of the phosphorus dopant in the second polysilicon layer. Therefore, the protrusions formed on the surface of the second polysilicon layer 120 due to the outgassing of the phosphorus dopant may be decreased. As a result, the reliability and durability of the non-volatile memory device may be further improved. In some embodiments, the thickness of the third polysilicon layer 150 is 1-50 nm.

As described above, the advantages of the non-volatile memory device and the method for manufacturing the non-volatile memory device in accordance with the embodiments of the invention include at least:

(1) Using a high content of $N_2^+$ ions as an ion source, the nitrogen dopant is concentrated on the surface of the first polysilicon layer. Therefore, the problems of over programming and over erasing may be significantly improved or solved, and the reliability and durability of the non-volatile memory device may be significantly improved.

(2) The formation of the first nitride film and the second nitride film can prevent the outgassing of the phosphorus dopant and decrease the protrusions on the surface of the second polysilicon layer. Therefore, the variation of the threshold voltage of the non-volatile memory device may be decreased, and the reliability and durability of the non-volatile memory device may be improved.

(3) Nitrogen dopant may be optionally doped in the tunneling oxide layer and the substrate to further block the phosphorus dopant. Therefore, the threshold voltage, reliability and durability of the non-volatile memory device may be further improved.

(4) The third polysilicon layer may be optionally formed to further prevent the outgassing of the phosphorous dopant and to further decrease the protrusions on the surface of the second polysilicon layer. Therefore, the reliability and durability of the non-volatile memory device may be further improved.

(5) The ion implantation process using $N_2^+$ ions as an ion source can be easily integrated into existing non-volatile memory device processes without substantial modification or replacement of process and/or production equipment, thus the effect on the cost of production is small.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A method for manufacturing a non-volatile memory device, comprising:
    forming a tunneling oxide layer on a substrate;
    forming a floating gate on the tunneling oxide layer, wherein forming the floating gate comprises:
        performing a first deposition process to form a first polysilicon layer on the tunneling oxide layer, wherein the first polysilicon layer is an undoped polysilicon layer;
        performing an ion implantation process to implant an impurity comprising $N_2$ into a surface of the first polysilicon layer;
        performing a second deposition process to form a second polysilicon layer on the first polysilicon layer, wherein the second polysilicon layer is a polysilicon layer doped with a dopant; and
        performing a heat treatment process to form a plurality of first polysilicon grains having a first grain size in the first polysilicon layer, and to form a plurality of second polysilicon grains having a second grain size in the second polysilicon layer, wherein the second grain size is greater than the first grain size;
    forming a dielectric layer formed on the floating gate; and
    forming a control gate on the dielectric layer.

2. The method for manufacturing a non-volatile memory device as claimed in claim 1, wherein an ion source used in the ion implantation process is an $N_2^+$ ion having a concentration that is equal to or more than 99%.

3. The method for manufacturing a non-volatile memory device as claimed in claim 1, wherein forming the dielectric layer formed on the floating gate comprises:
    forming a first nitride film on a surface of the floating gate; and
    conformally forming a three-layer structure consisting of a first oxide layer, a nitride layer, and a second oxide layer on the first nitride film.

4. The method for manufacturing a non-volatile memory device as claimed in claim 3, wherein forming the dielectric layer formed on the floating gate further comprises:
    conformally forming a second nitride film on the three-layer structure.

5. The method for manufacturing a non-volatile memory device as claimed in claim 1, wherein the second deposition process comprises an in-situ doping process, and the in-situ doping process uses phosphorus as the dopant.

6. The method for manufacturing a non-volatile memory device as claimed in claim 1 that, after performing the second deposition process, further comprises:
    performing a third deposition process to form a third polysilicon layer on the second polysilicon layer, wherein the third polysilicon layer is an undoped polysilicon layer.

* * * * *